(12) United States Patent  
Huang et al.

(10) Patent No.: US 8,587,131 B1  
(45) Date of Patent: Nov. 19, 2013

(54) THROUGH-SILICON VIA AND FABRICATION METHOD THEREOF

(75) Inventors: Chi-Wen Huang, Taouyuan County (TW); Kuo-Hui Su, Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/490,472

(22) Filed: Jun. 7, 2012

(51) Int. Cl.
*H01L 23/48* (2006.01)
*H01L 23/52* (2006.01)
*H01L 29/40* (2006.01)
*H01L 21/4763* (2006.01)

(52) U.S. Cl.
USPC ........... 257/778; 438/620; 438/618; 438/622; 438/638

(58) Field of Classification Search
USPC .......................... 438/597–688; 257/741–786
See application file for complete search history.

(56) References Cited

U.S. PATENT DOCUMENTS

| | | | |
|---|---|---|---|
| 7,279,790 B2 * | 10/2007 | Kitada et al. | 257/758 |
| 2009/0191708 A1 * | 7/2009 | Kropewnicki et al. | 438/667 |
| 2009/0305502 A1 * | 12/2009 | Lee et al. | 438/667 |
| 2009/0321796 A1 * | 12/2009 | Inohara | 257/288 |
| 2010/0252934 A1 * | 10/2010 | Law et al. | 257/774 |
| 2011/0254165 A1 * | 10/2011 | Muranaka | 257/751 |
| 2011/0318923 A1 * | 12/2011 | Park et al. | 438/675 |

* cited by examiner

*Primary Examiner* — Fernando L Toledo
*Assistant Examiner* — Karen Kusumakar
(74) *Attorney, Agent, or Firm* — Winston Hsu; Scott Margo

(57) ABSTRACT

A through silicon via (TSV) structure including a semiconductor substrate; a first inter-metal dielectric (IMD) layer on the semiconductor substrate; a cap layer overlying the IMD layer; a conductive layer extending through the cap layer, the first IMD layer and into the semiconductor substrate; a tungsten film capping a top surface of the conductive layer; a second IMD layer overlying the cap layer and covering the tungsten film; and an interconnect feature in the second IMD layer.

6 Claims, 4 Drawing Sheets

THROUGH-SILICON VIA AND FABRICATION METHOD THEREOF

BACKGROUND OF THE INVENTION

1. Field of the Invention

The present invention relates generally to semiconductor technology, and more particularly to a through-silicon via (TSV) for connection of stacked chips and a method for forming the same.

2. Description of the Prior Art

Packaging technology for an integrated circuit has continuously been developed to meet the demand toward miniaturization and mounting reliability. As known in the art, stack package is a vertical stand or pile of at least two chips or packages, one atop the other. By using a stack, in the case of a memory device for example, it is possible to produce a product having a memory capacity which is two times greater than that obtainable through semiconductor integration processes.

A stack package provides advantages not only through an increase in memory capacity but also in view of a mounting density and mounting area utilization efficiency. As an example of a stack package, a through-silicon via (TSV) has been disclosed in the art. The stack package using a TSV has a structure in which the TSV is formed in a chip so that chips are physically and electrically connected with each other through the TSV.

Through silicon via (TSV) is typically fabricated to provide the through-via filled with a conducting material that pass completely through the silicon layer to contact and connect with the other TSVs and conductors of the bonded layers. For example, a vertical hole is defined through a predetermined portion of each chip at a wafer level. An insulation layer is formed on the surface of the vertical hole. With a seed metal layer formed on the insulation layer, a metal is filled into the vertical hole through an electroplating process to form a TSV. Then, the TSV is exposed through back-grinding of the backside of a wafer. After the wafer is sawed and is separated into individual chips, at least two chips can be vertically stacked, one atop the other, on one of the substrates using one or more of the TSV. Thereupon, the upper surface of the substrate including the stacked chips is molded, and solder balls are mounted on the lower surface of the substrate.

SUMMARY OF THE INVENTION

In one aspect, the present invention provides a through silicon via (TSV) structure including a semiconductor substrate; a first inter-metal dielectric (IMD) layer on the semiconductor substrate; a cap layer overlying the IMD layer; a conductive layer extending through the cap layer, the first IMD layer and into the semiconductor substrate; a tungsten film capping a top surface of the conductive layer; a second IMD layer overlying the cap layer and covering the tungsten film; and an interconnect feature in the second IMD layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
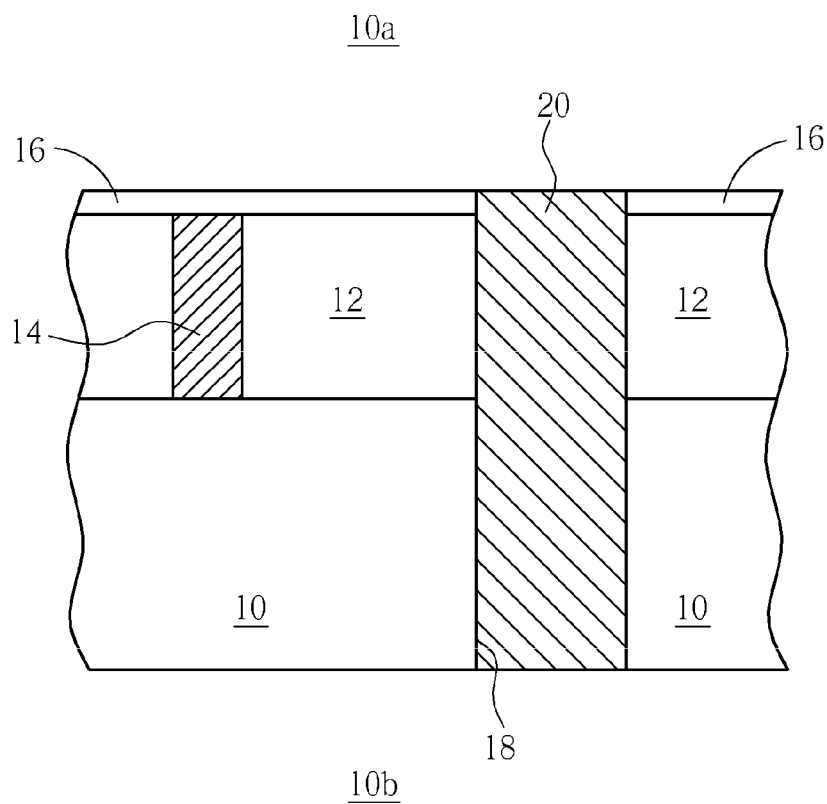
FIGS. 1-4 are schematic, cross-sectional diagrams showing an exemplary method for fabricating a through silicon via (TSV) in accordance with one embodiment of this invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

FIGS. 1-4 are schematic, cross-sectional diagrams showing an exemplary method for fabricating a through silicon via (TSV) in accordance with one embodiment of this invention. As shown in FIG. 1, a semiconductor substrate 10 having a front side 10a and a back side 10b is provided. It is to be understood that the semiconductor substrate 10 may be a base layer in other cases. An inter-metal dielectric (IMD) layer 12 may be formed on the front side 10a of the semiconductor substrate 10. A tungsten plug 14 or tungsten local interconnect may be formed in the IMD layer 12. A cap layer 16 such as a silicon nitride layer may be formed on the IMD layer 12. A TSV trench 18 is then etched into the cap layer 16, the IMD layer 12 and the semiconductor substrate 10. A barrier or seed layer (not explicitly shown) may be formed inside the TSV trench 18. A conductive layer 20 such as copper may be deposited into the TSV trench 18 by using, for example, electroplating or the like. Thereafter, a chemical mechanical polishing (CMP) may be performed to remove the excess conductive layer 20 outside the TSV trench 18. At this point, a top surface of the conductive layer 20 is flush with a top surface of the cap layer 16 that may act as a polish stop during CMP.

Figure 2:
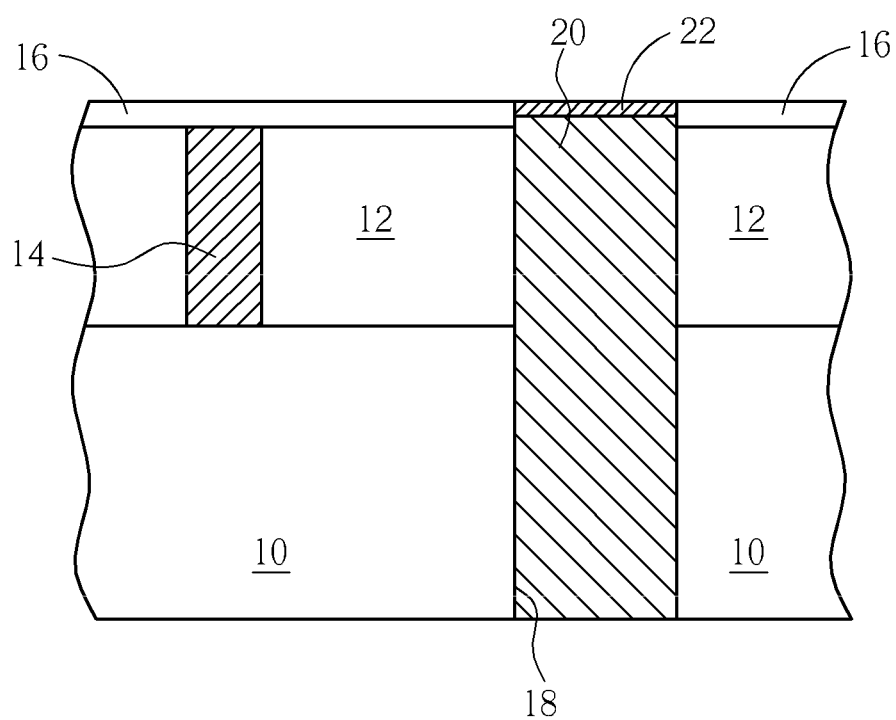

As shown in FIG. 2, a selective tungsten chemical vapor deposition (WCVD) process is then performed to selectively deposit a tungsten film 22 on the exposed top surface of the conductive layer 20. For example, the semiconductor substrate 10 may be subjected to a degassing treatment (degassing condition: 250° C.), the degassed substrate is then introduced into a chamber for the pre-treatment, and then the substrate may be heated to a pre-treating temperature of 250° C. Subsequently, 50 sccm of N2 gas and 100 sccm of H2 gas may be simultaneously introduced into the chamber and a discharge may be induced with an RF plasma generator to subject the substrate surface to a pre-treatment for 30 seconds. After the pre-treatment, the substrate is moved to a chamber for carrying out the selective WCVD. For example, the substrate may be heated up to 250° C., and 10 sccm of WF6 and 5 sccm of SiH4 may be introduced into the chamber to thus form the tungsten film 22 on the copper surface.

Figure 3:
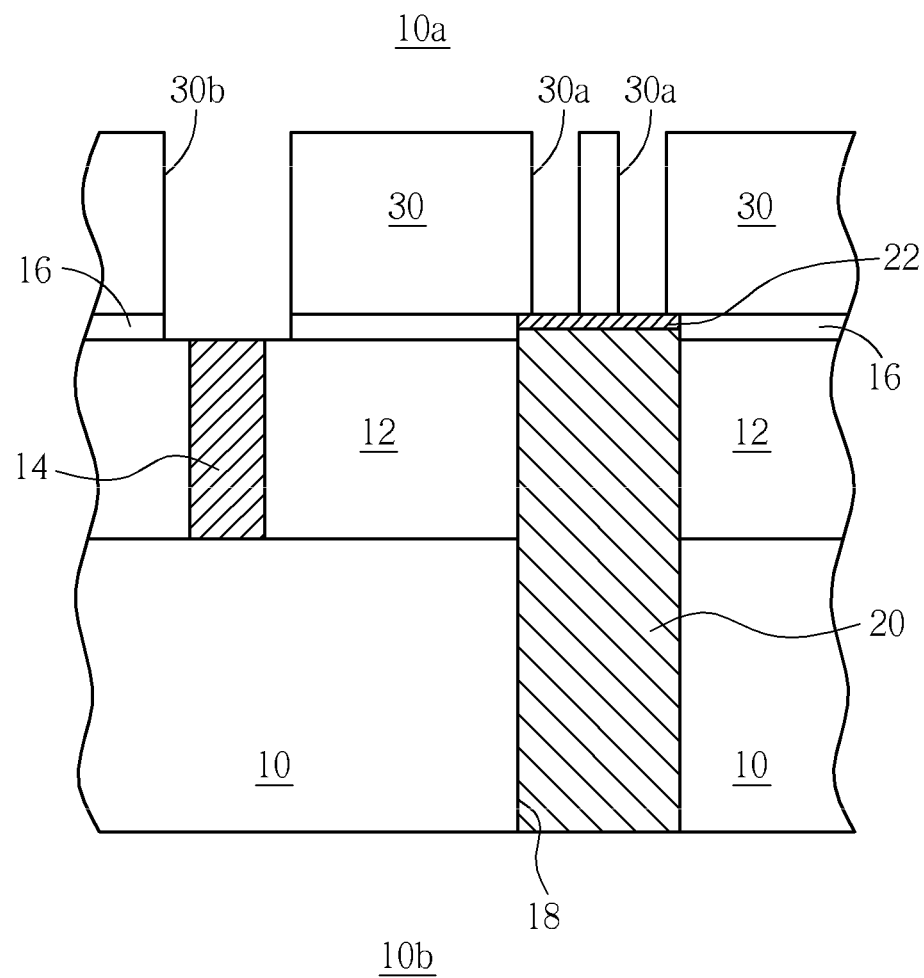

Subsequently, as shown in FIG. 3, a CVD process may be carried out to deposit an IMD layer 30 such as a silicon oxide layer. The IMD layer 30 covers the cap layer 16 and the tungsten film 22. A lithographic process and a dry etching process are performed to create interconnection structures 30a and 30b in the IMD layer 30. The interconnection structures 30a and 30b, in accordance with one embodiment, may be damascened trenches. The interconnection structures 30a extend the entire thickness of the IMD layer 30 and expose a portion of the tungsten film 22. The interconnection structure 30b extends through the IMD layer 30 and the cap layer 16 and exposes the top surface of the tungsten plug 14. A portion of the IMD layer 12 may be exposed too. The substrate is then subjected to a pre-clean process for removing tungsten oxide from the exposed tungsten surfaces. For example, the exposed tungsten surfaces may be bombarded by argon.

Figure 4:
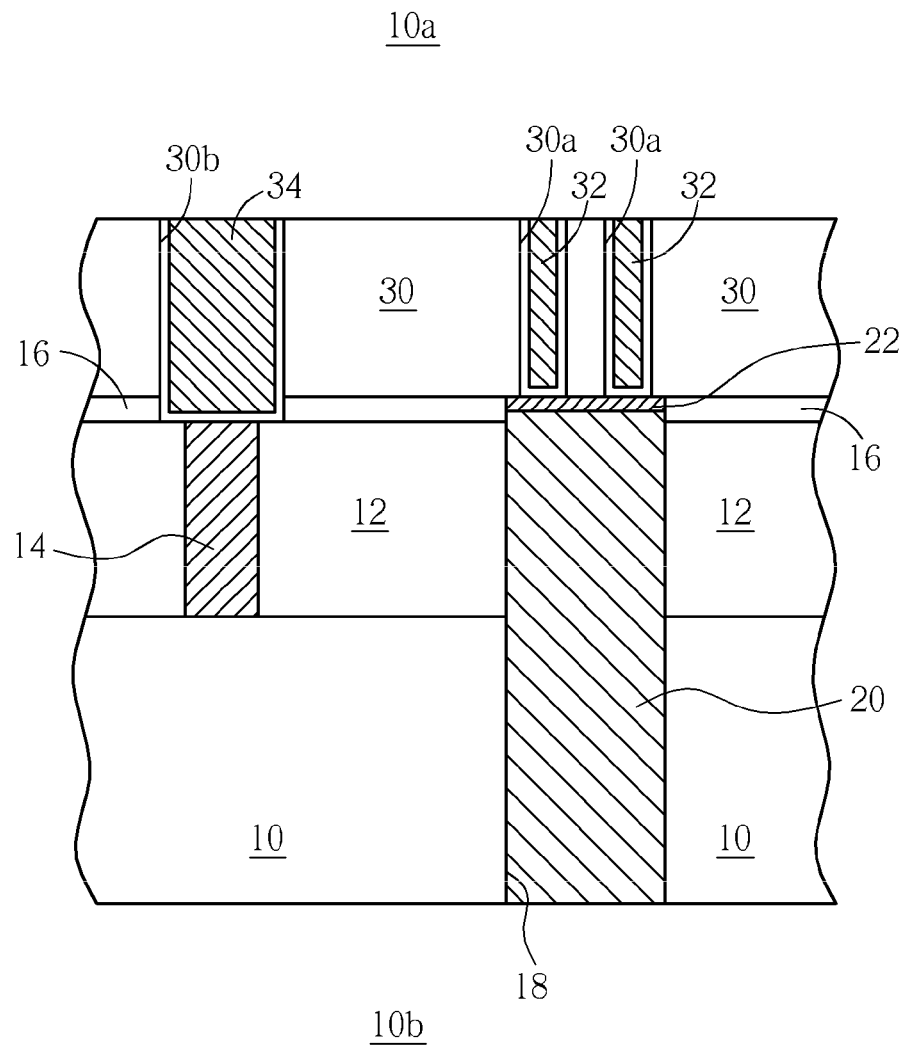

As shown in FIG. 4, after the formation of the interconnection recess structures 30a and 30b, a copper damascene process is performed to fill the interconnection structures 30a and 30b with copper interconnect features 32 and 34 including but not limited to a barrier layer and a copper layer. It is advantageous to use the invention because during the pre-clean process prior to the formation of the copper interconnect features 32 and 34, only the tungsten surfaces are exposed and therefore the damage to TSV due to argon bombardment can be avoided. The electrical performance of copper interconnect features 32 and 34 is improved. According to the embodiment, the structural features as set forth in FIG. 4 may include: (1) the tungsten film 22 that is selectively formed on the top surface of the conductive layer or copper layer 20; and (2) the copper interconnect features 32 that are in direct contact with the tungsten film 22.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a semiconductor substrate;
a first inter-metal dielectric (IMD) layer on the semiconductor substrate;
a tungsten plug embedded in the IMD layer;
a cap layer overlying the IMD layer and capping the tungsten plug;
a through silicon via (TSV) comprising: a conductive layer penetrating through the cap layer, the first IMD layer and the semiconductor substrate, wherein the conductive layer has a top surface that is flush with a top surface of the cap layer; and a tungsten film capping entire said top surface of the conductive layer;
a second IMD layer overlying the cap layer and covering the tungsten film;
a first interconnect feature penetrating through the second IMD layer to electrically connect with the TSV; and
a second interconnect feature penetrating through the second IMD layer and the cap layer to electrically connect with the tungsten plug.

2. The semiconductor structure according to claim 1 wherein the cap layer comprises silicon nitride.

3. The semiconductor structure according to claim 1 wherein the first or second interconnect feature comprises copper damascene structure.

4. The semiconductor structure according to claim 1 wherein the first interconnect feature is in direct contact with the tungsten film.

5. The semiconductor structure according to claim 1 wherein the first IMD layer comprises silicon oxide.

6. The semiconductor structure according to claim 1 wherein the second IMD layer comprises silicon oxide.

* * * * *